United States Patent
Chiu et al.

(10) Patent No.: US 9,999,132 B2
(45) Date of Patent: Jun. 12, 2018

(54) ELECTRONIC PACKAGE

(71) Applicant: Siliconware Precision Industries Co., Ltd., Taichung (TW)

(72) Inventors: Chih-Hsien Chiu, Taichung (TW);
Chia-Yang Chen, Taichung (TW);
Ying-Wei Lu, Taichung (TW);
Jyun-Yuan Jhang, Taichung (TW);
Ming-Fan Tsai, Taichung (TW)

(73) Assignee: Silicon Precision Industries Co., Ltd., Taichung (TW)

( * ) Notice: Subject to any disclaimer, the term of this patent is extended or adjusted under 35 U.S.C. 154(b) by 0 days. days.

(21) Appl. No.: 15/163,045

(22) Filed: May 24, 2016

(65) Prior Publication Data
US 2017/0231095 A1    Aug. 10, 2017

(30) Foreign Application Priority Data
Feb. 4, 2016   (TW) .............................. 105103744 A (51) Int. Cl.
| | |
|---|---|
| *H05K 1/18* | (2006.01) |
| *G06K 19/077* | (2006.01) |
| *H01L 25/00* | (2006.01) |
| *H05K 1/16* | (2006.01) |
| *H05K 3/00* | (2006.01) |
| *H05K 3/10* | (2006.01) |
| *H05K 3/20* | (2006.01) |
| *H05K 3/46* | (2006.01) |

(52) U.S. Cl.
CPC ....... *H05K 1/185* (2013.01); *G06K 19/07777* (2013.01); *H01L 25/00* (2013.01); *H05K 1/165* (2013.01); *H05K 3/0014* (2013.01); *H05K 3/465* (2013.01); *H01L 2224/16225* (2013.01); *H01L 2224/48091* (2013.01); *H01L 2924/1815* (2013.01); *H05K 1/186* (2013.01); *H05K 3/107* (2013.01); *H05K 3/207* (2013.01); *H05K 3/4602* (2013.01); *H05K 2201/09118* (2013.01); *H05K 2201/10098* (2013.01); *H05K 2203/1327* (2013.01)

(58) Field of Classification Search
None
See application file for complete search history.

(56) References Cited

U.S. PATENT DOCUMENTS

| | | | | |
|---|---|---|---|---|
| 8,199,518 | B1* | 6/2012 | Chun ................ | H01L 23/49811 361/767 |
| 9,496,219 | B2* | 11/2016 | Yoo ................... | H01L 23/49827 |
| 2006/0033664 | A1* | 2/2006 | Soler Castany ........ | H01L 23/66 343/700 MS |

(Continued)

*Primary Examiner* — Robert Carpenter
(74) *Attorney, Agent, or Firm* — Mintz Levin Cohn Ferris Glovsky and Popeo, P.C.; Peter F. Corless; Steven M. Jensen (57) ABSTRACT

An electronic package is provided, which includes: a substrate, an electronic element disposed on the substrate, and an antenna structure disposed on the substrate. The antenna structure has a base portion and at least a support portion, the base portion including a plurality of openings and a frame separating the openings from one another, and the support portion supporting the base portion over the substrate. Therefore, no additional area is required to be defined on a surface of the substrate, and the miniaturization requirement of the electronic package is thus met.

11 Claims, 6 Drawing Sheets

(56) References Cited

U.S. PATENT DOCUMENTS

| | | | |
|---|---|---|---|
| 2009/0168367 A1* | 7/2009 | Fujii | H01L 23/3128 361/720 |
| 2009/0184882 A1* | 7/2009 | Jow | H01L 23/3121 343/873 |
| 2011/0241969 A1* | 10/2011 | Zhang | H01Q 11/04 343/853 |
| 2012/0188138 A1* | 7/2012 | Liu | H01Q 1/2283 343/776 |
| 2014/0035097 A1* | 2/2014 | Lin | H01Q 21/065 257/531 |
| 2014/0252595 A1* | 9/2014 | Yen | H01L 23/498 257/737 |
| 2015/0145108 A1* | 5/2015 | Yap | H01L 21/768 257/664 |
| 2015/0295305 A1* | 10/2015 | Herbsommer | H01Q 19/108 343/873 |
| 2015/0340765 A1* | 11/2015 | Dang | H01Q 21/0075 343/893 |
| 2016/0329299 A1* | 11/2016 | Lin | H01L 23/5226 |

* cited by examiner

ELECTRONIC PACKAGE

CROSS-REFERENCE TO RELATED APPLICATION

This application claims under 35 U.S.C. § 119(a) the benefit of Taiwanese Patent Application No.105103744 filed Feb. 4, 2016, the entire contents of which are incorporated herein by reference.

BACKGROUND

1. Technical Field

The present disclosure relates to electronic packages, and, more particularly, to an electronic package having an antenna structure.

2. Description of Related Art

Along with the rapid development of electronic industries, wireless communication technologies have been widely applied in various kinds of consumer electronic products for receiving or transmitting various wireless signals. To meet the miniaturization requirement of consumer electronic products, wireless communication modules are becoming lighter, thinner, shorter and smaller. For example, patch antennas have been widely applied in wireless communication modules of electronic products, such as cell phones and personal digital assistants (PDAs), due to their advantages of small size, light weight and easy fabrication.

Figure 1:
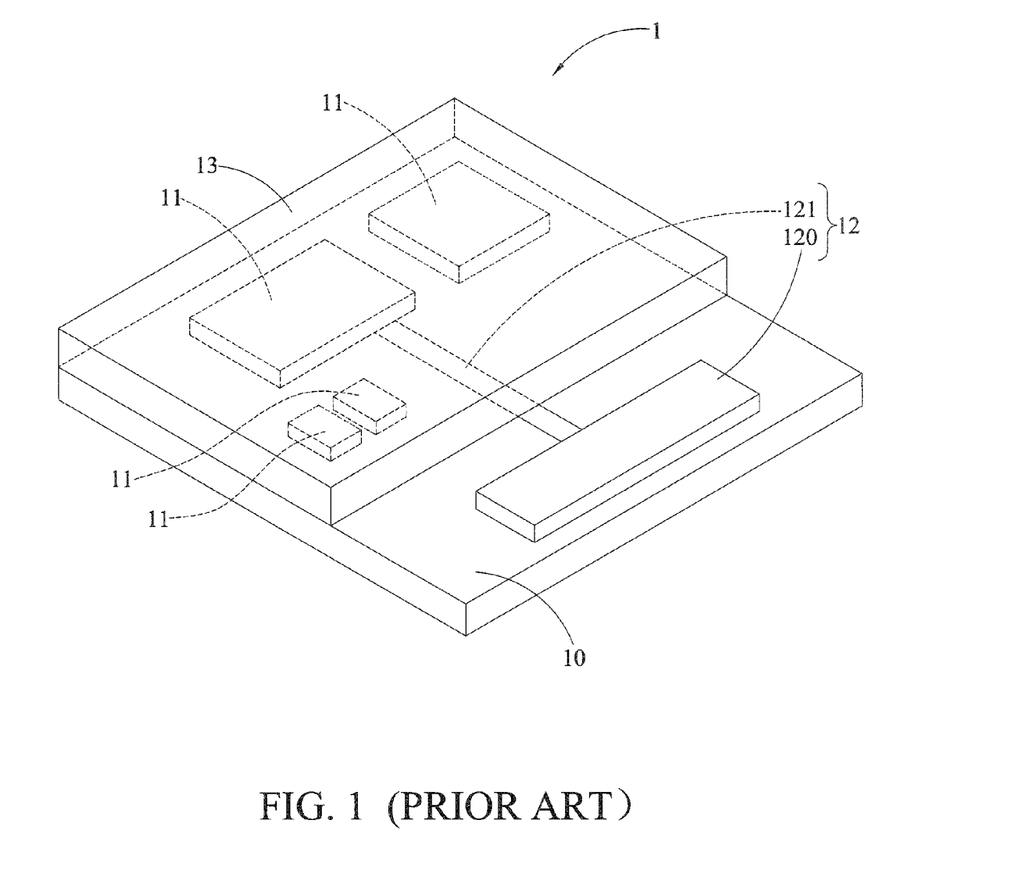
FIG. 1 is a schematic perspective view of a conventional wireless communication module.

FIG. 1 is a schematic perspective view of a conventional wireless communication module 1. The wireless communication module 1 has a packaging substrate 10, a plurality of electronic elements 11 disposed on and electrically connected to the packaging substrate 10, an antenna structure 12 disposed on the packaging substrate 10, and an encapsulant 13. The packaging substrate 10 is a rectangular circuit board. The antenna structure 12 is of a planar type and has an antenna body 120 and a conductive wire 121 electrically connecting the antenna body 120 and the electronic elements 11. The encapsulant 13 encapsulates the electronic elements 11 and a portion of the conductive wire 121.

However, during the fabrication process of the wireless communication module 1, the antenna body 120 of the antenna structure 12 cannot be integrally fabricated with the electronic elements 11 due to the characteristic of electromagnetic radiation between the antenna structure 12 and the electronic elements 11 and the size limitation of the planar-type antenna structure 12. As such, the electronic elements 11 are encapsulated by the encapsulant 13, while the antenna body 120 of the antenna structure 12 is exposed from the encapsulant 13. Therefore, the packaging process for forming the encapsulant 13 needs a mold having a size corresponding to the electronic element-mounting area instead of the overall size of the packaging substrate 10, thus adversely affecting the packaging process.

Further, since the surface of the packaging substrate 10 needs an additional area for the antenna body 120 to be disposed therewithin (i.e., an area where the encapsulant 13 is not to be formed), the size of the packaging substrate 10 and thus the size of the wireless communication module 1 are increased. Consequently, the wireless communication module 1 cannot meet the miniaturization requirement.

Therefore, how to overcome the above-described drawbacks has become critical.

SUMMARY

In view of the above-described drawbacks, the present disclosure provides an electronic package, which comprises: a substrate; at least an electronic element disposed on the substrate; and at least an antenna structure disposed on the substrate and having a base portion and at least a support portion, the base portion including a plurality of openings and a frame separating the openings from one another, and the at least a support portion supporting the base portion over the substrate.

In an embodiment, the substrate has a circuit layer electrically connected to the electronic element.

In an embodiment, the antenna structure is electrically connected to the substrate.

In an embodiment, the antenna structure is electrically connected to the electronic element.

In an embodiment, the antenna structure is made of metal.

In an embodiment, the openings are alternately arranged in an array.

In an embodiment, each of the openings has a polygonal shape, a circular shape or a closed curved shape.

In an embodiment, the electronic package further comprises an encapsulant formed on the substrate. In an embodiment, the encapsulant encapsulates the electronic element with the frame exposed from the encapsulant. The frame may protrude above the encapsulant or not. In an embodiment, the antenna structure is completely encapsulated by the encapsulant.

Therefore, the present disclosure provides a vertical type antenna structure instead of a planar type antenna structure. The antenna structure according to the present disclosure can be vertically disposed on the area of the substrate where the electronic element is mounted, thereby allowing a mold in a packaging process to have a size corresponding to the substrate so as to facilitate the packaging process.

Further, by vertically disposing the antenna structure on the area of the substrate where the electronic element is mounted (i.e., the area where the encapsulant is formed), the present disclosure dispenses with the additional area on the substrate as required in the prior art. As such, the present disclosure effectively reduces the size of the substrate and accordingly the size of the electronic package, and thus meets the miniaturization requirement of the electronic package.

BRIEF DESCRIPTION OF DRAWINGS

FIG. 2D' is a schematic perspective view showing another embodiment of FIG. 2D;

DETAILED DESCRIPTION OF PREFERRED EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2D are schematic views of an electronic package 2 according to the present disclosure. The electronic package 2 comprises a substrate 10, a plurality of electronic elements 21, 21' disposed on the substrate 10, and an antenna structure 22 disposed on the substrate 10.

In an embodiment, the electronic package 2 is a system-in-package (SiP) wireless communication module.

Figure 2A:
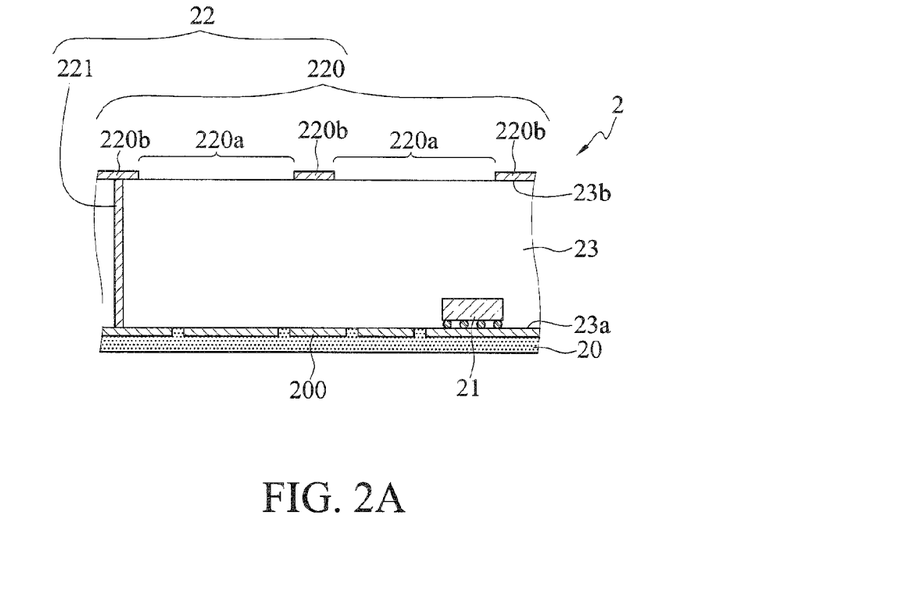
FIG. 2A is a schematic cross-sectional view of an electronic package according to the present disclosure.
Figure 2B:
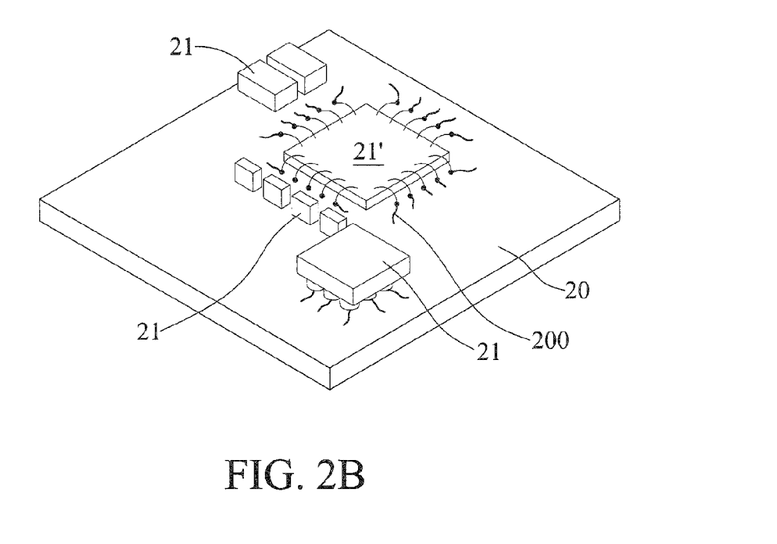
FIG. 2B is a schematic partial perspective view of FIG. 2A.

The substrate 20 is a circuit or ceramic board and has a rectangular shape. Referring to FIG. 2B, the substrate 20 has a circuit layer 200 formed on a surface thereof. Further, the substrate 20 has circuit layers formed therein (not shown).

Referring to FIG. 2B, the electronic elements 21, 21' are electrically connected to the circuit layer 200 of the substrate 20. In an embodiment, each of the electronic elements 21, 21' is an active element such as a semiconductor chip, a passive element such as a resistor, a capacitor or an inductor, or a combination thereof. In an embodiment, referring to FIG. 2B, the electronic elements 21 are electrically connected to the circuit layer 200 in a flip-chip manner, and the electronic element 21' is electrically connected to the circuit layer 200 through wire bonding.

The antenna structure 22 has a base portion 220 and at least a support portion 221. The support portion 221 is a metal post and vertically disposed on the substrate 20, and the base portion 220 is supported over the substrate 20 through the support portion 221. The base portion 220 has a plurality of openings 220a and a frame 220b separating the openings 220a from one another.

In an embodiment, the antenna structure 22 is prepared from a metal board or frame first, and then directly attached to the substrate 20. In an embodiment, the antenna structure 22 has a closed configuration, as shown in FIG. 2C, or has an open configuration, as shown in FIG. 2C'.

Figure 2C:
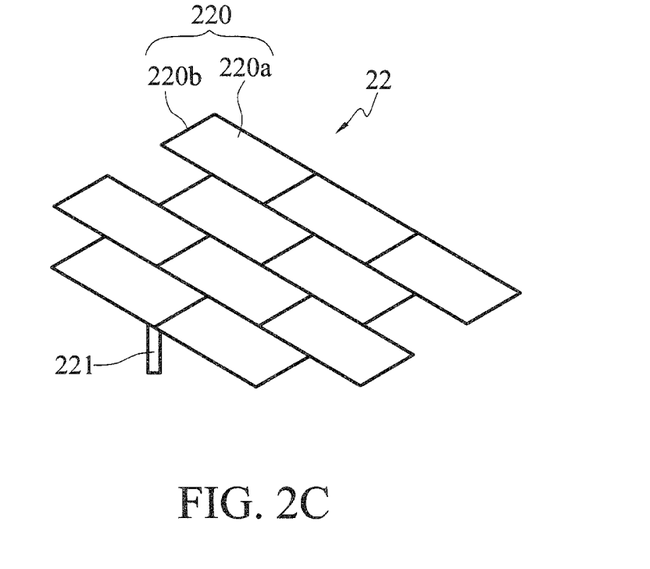
FIGS. 2C and 2C' are schematic perspective views of an antenna structure of FIG. 2A according to different embodiments of the present disclosure.

Referring to FIGS. 2C and 2C', the openings 220a are alternately arranged in an array. In an embodiment, each of the openings 220a has, but not limited to, a polygonal shape, a circular shape or other closed curved shape.

The support portion 221 can be disposed on the frame 220b at an edge of the base portion 220 (as shown in FIG. 2C) or in the middle of the base portion 220 (as shown in FIG. 2C'). According to the practical need, one support portion 221 (as shown in FIG. 2C) or a plurality of support portions 221 (as shown in FIG. 2C') can be provided.

Figure 3:
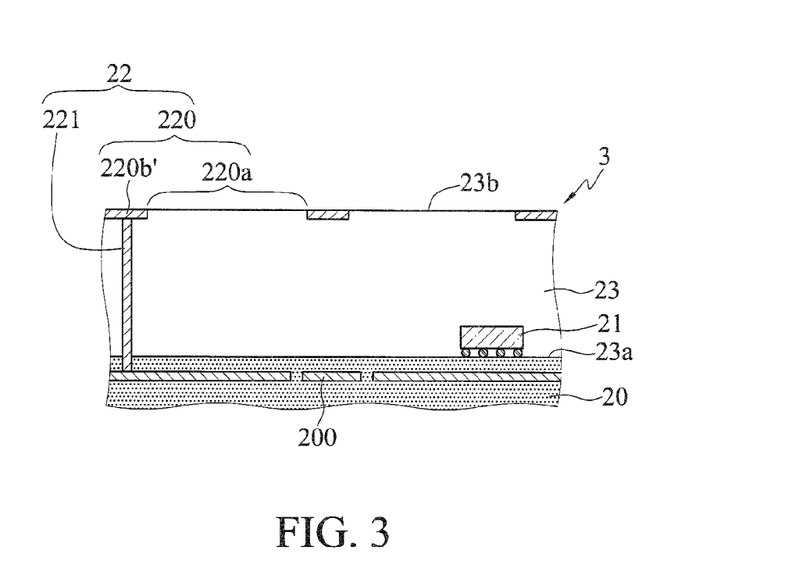
FIGS. 3 and 3' are schematic cross-sectional views showing other embodiments of FIG. 2A.

Further, referring to FIGS. 2A and 3, the antenna structure 22 is electrically connected to the circuit layer 200 of the substrate 20 through the support portion 221. Alternatively, referring to FIG. 3', the antenna structure 22 is electrically connected to the electronic element 21' through the support portion 221.

Figure 2D:
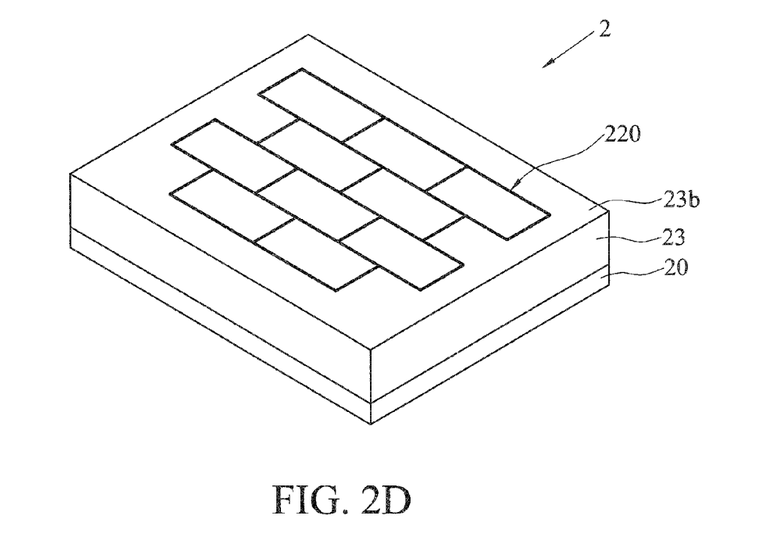
FIG. 2D is a schematic perspective view of FIG. 2A.

Furthermore, referring to FIGS. 2A and 2D, the electronic package 2 can optionally have an encapsulant 23.

The encapsulant 23 is formed on the substrate 20 to encapsulate the electronic elements 21 and the support portion 221. The encapsulant 23 has a first surface 23a and a second surface 23b opposite to the first surface 23a, and is bonded to the substrate 20 via the first surface 23a thereof.

In an embodiment, the encapsulant 23 is made of an insulating material, such as polyimide, a dry film, an epoxy resin, or a molding compound.

Referring to FIGS. 2A and 2D, the frame 220b is exposed from the second surface 23b of the encapsulant 23. In an embodiment, the frame 220b protrudes above the second surface 23b of the encapsulant 23.

In other embodiments, referring to electronic packages 3, 3' of FIGS. 3 and 3', the frames 220b', 220b" do not protrude above the encapsulant 23. In an embodiment, referring to FIG. 3, the surface of the frame 220b' is flush with the second surface 23b of the encapsulant 23. Alternatively, referring to FIG. 3', the surface of the frame 220b" is lower than the second surface 23b of the encapsulant 23. Therefore, in other embodiments, to fabricate the antenna structure 22, a plurality of slots and through holes are formed on the second surface 23b of the encapsulant 23 first, and then a coating process such as sputter coating, plating, spraying or printing is performed to form a metal material in the slots and the through holes. As such, the frame 220b', 220b" is formed from the metal material in the slots, and the support portion 221 is formed from the metal material in the through holes. Alternatively, the coating process can be combined with a metal board or frame for fabricating the antenna structure 22.

Figure 4:
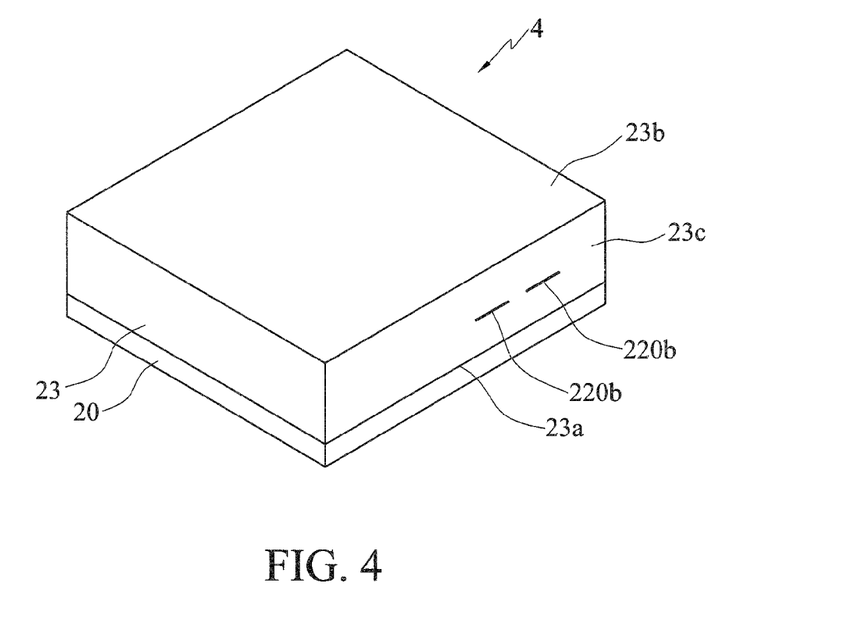
FIGS. 4 and 4' are schematic perspective views showing other embodiments of FIG. 2D.

In another embodiment, referring to an electronic package 4 of FIG. 4, the frame 220b is exposed from a side surface 23c of the encapsulant 23 that is adjacent to and connected to the first surface 23a and the second surface 23b.

In a further embodiment, referring to an electronic package 4' of FIG. 4', the antenna structure 22 is completely encapsulated by the encapsulant 23.

Further, referring to FIG. 2D', the electronic package 2' can have a plurality of antenna structures. For example, two base portions 220 are exposed from the encapsulant 23.

In the electronic package 2, 2', 3, 3', 4, 4' according to the present disclosure, the vertical type antenna structure 22, 22' is formed from a metal board or frame by bending or formed through a coating process, and then the frame 220b, 220b', 220b" is disposed over the substrate 20 and the electronic elements 21, 21'. As such, the antenna structure 22 can be integrally fabricated with the electronic elements 21, 21'. That is, the antenna structure 22 and the electronic elements 21, 21' are packaged together, and hence both the antenna structure 22, 22' and the electronic elements 21, 21' are encapsulated by the encapsulant 23. Therefore, the present disclosure allows the mold in the packaging process to have a size corresponding to the substrate 20 so as to facilitate the packaging process.

Further, the encapsulant 23 facilitates to fasten the antenna structure 22, 22' and cause the frame 220b, 220b', 220b" to be positioned at a fixed height level so as to ensure the stability of the antenna. Furthermore, the dielectric constant of the encapsulant 23 facilitates to reduce the electrical length required by the antenna.

Moreover, since the frame 220b, 220b', 220b" is disposed over the substrate 20 to form a vertical type antenna structure, the antenna structure 22 can be disposed on the same area of the substrate 20 where the electronic elements 21, 21' are mounted (i.e., the area where the encapsulant 23 is formed). Consequently, the present disclosure dispenses with the additional area on the substrate 20 as required in the prior art, effectively reduces the size of the substrate 20 and accordingly the size of the electronic package 2, 2', 3, 3', 4, 4', and meets the miniaturization requirement of the electronic package 2, 2', 3, 3', 4, 4'.

In addition, by disposing the frame 220b, 220b', 220b" over the substrate 20, a receiving space is formed between the frame 220b, 220b', 220b" and the substrate 20. The receiving space can be used for receiving other electrical structures or electronic elements.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
   a substrate;
   at least an electronic element disposed on the substrate;
   a single encapsulant integrally formed on the substrate and encapsulating the electronic element, wherein the single encapsulant has a first surface, a second surface opposite to the first surface, and a side surface adjacent to and connected to the first surface and the second surface, and the single encapsulant is bonded to the substrate via the first surface of the single encapsulant; and
   at least an antenna structure disposed on the substrate and having a base portion and at least a support portion, the base portion being in direct contact with the single encapsulant and including a plurality of openings and a frame separating the openings from one another, and the at least a support portion supporting the base portion over the substrate, wherein the frame is exposed from the side surface of the single encapsulant.

2. The electronic package of claim 1, wherein the substrate has a circuit layer electrically connected to the electronic element.

3. The electronic package of claim 1, wherein the antenna structure is electrically connected to the substrate.

4. The electronic package of claim 1, wherein the antenna structure is electrically connected to the electronic element.

5. The electronic package of claim 1, wherein the antenna structure is made of metal.

6. The electronic package of claim 1, wherein the openings are alternately arranged in an array.

7. The electronic package of claim 1, wherein each of the openings has a polygonal shape, a circular shape or a closed curved shape.

8. The electronic package of claim 1, wherein the frame is exposed from the single encapsulant.

9. The electronic package of claim 8, wherein the frame protrudes above the single encapsulant.

10. The electronic package of claim 8, wherein the frame is free from protruding above the single encapsulant.

11. The electronic package of claim 1, wherein the single encapsulant completely encapsulates the antenna structure.

* * * * *